US008358017B2

(12) United States Patent
Tsui (10) Patent No.: US 8,358,017 B2
(45) Date of Patent: Jan. 22, 2013

(54) SEMICONDUCTOR PACKAGE FEATURING FLIP-CHIP DIE SANDWICHED BETWEEN METAL LAYERS

(75) Inventor: Anthony C. Tsui, Saratoga, CA (US)

(73) Assignee: GEM Services, Inc., Santa Clara, CA (US)

(*) Notice: Subject to any disclaimer, the term of this patent is extended or adjusted under 35 U.S.C. 154(b) by 367 days.

(21) Appl. No.: 12/186,342

(22) Filed: Aug. 5, 2008

(65) Prior Publication Data
US 2009/0283919 A1 Nov. 19, 2009

Related U.S. Application Data

(60) Provisional application No. 61/053,561, filed on May 15, 2008.

(51) Int. Cl.
*H01L 23/48* (2006.01)
(52) U.S. Cl. ........ 257/778; 257/675; 257/686; 257/696; 257/738; 257/777; 257/E23.011; 257/E23.021; 257/E23.051
(58) Field of Classification Search .................. 257/675, 257/686, 695, 738, 777, E23.011, E23.021, 257/E23.051
See application file for complete search history.

(56) References Cited

U.S. PATENT DOCUMENTS

| 7,619,303 | B2* | 11/2009 | Bayan .......................... 257/666 |
| 7,705,476 | B2* | 4/2010 | Bayan et al. .................. 257/787 |
| 2005/0224945 | A1* | 10/2005 | Saito et al. .................... 257/686 |

* cited by examiner

*Primary Examiner* — Andy Huynh
(74) *Attorney, Agent, or Firm* — Kilpatrick Townsend & Stockton LLP (57) ABSTRACT

Embodiments in accordance with the present invention relate to flip-chip packages for semiconductor devices, which feature a die sandwiched between metal layers. One metal layer comprises portions of the lead frame configured to be in electrical and thermal communication with various pads on a first surface of the die (e.g. IC pads or MOSFET gate or source pads) through a solder ball contact. The other metal layer is configured to be in at least thermal communication with the opposite side of the die. Embodiments of packages in accordance with the present invention exhibit superior heat dissipation qualities, while avoiding the expense of wire bonding. Embodiments of the present invention are particularly suited for packaging of power devices.

22 Claims, 13 Drawing Sheets

Punched

FIGURE 2C

J LEADS

SEMICONDUCTOR PACKAGE FEATURING FLIP-CHIP DIE SANDWICHED BETWEEN METAL LAYERS

CROSS-REFERENCE TO RELATED APPLICATION

The instant nonprovisional patent application claims priority to the U.S. Provisional Patent Application No. 61/053,561, filed May 15, 2008 and incorporated by reference in its entirety herein for all purposes.

BACKGROUND OF THE INVENTION

Figure 1:
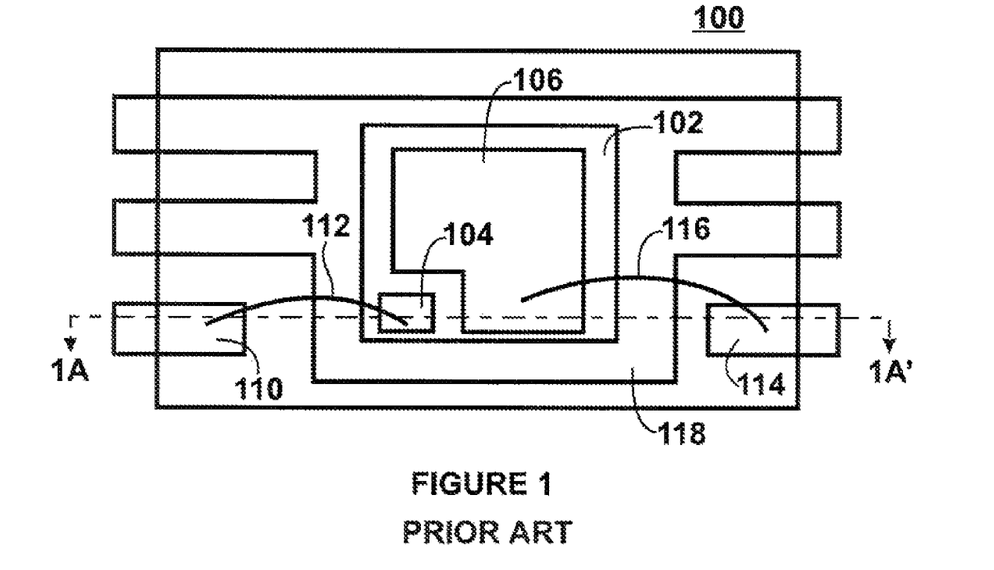
FIG. 1 shows a simplified plan view of a conventional power MOSFET package.
Figure 1A:
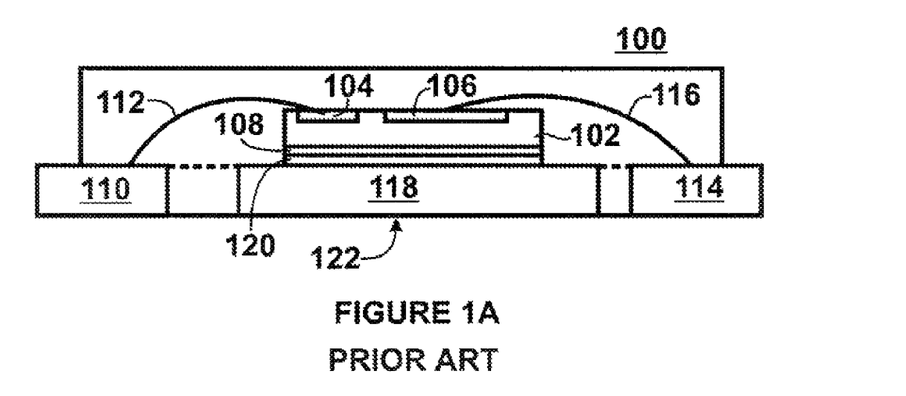
FIG. 1A shows a simplified cross-sectional view of the conventional package of FIG. 1, taken along line 1A-1A'.

FIG. 1 shows a simplified plan view of a conventional package housing a power MOSFET die. FIG. 1A shows a simplified cross-sectional view of the package of FIG. 1, taken along line 1A-1A'.

Specifically, the conventional power MOSFET package 100 comprises power MOSFET die 102 having a top surface and featuring gate pad 104 and source pad 106. Gate pad 104 is configured to be in electrical communication with first lead 110 through bond wire 112, and source pad 106 is configured to be in electrical communication with second lead 114 through bond wire 116.

The bottom surface of die 102 features the drain pad 108. The drain pad is in electrical communication with an underlying die pad 118 through an electrically conducting adhesive material 120. This adhesive material 120 is also thermally conductive, allowing heat generated by the MOSFET die during operation, to be transported out of the package through the heat sink 122 formed by the lower surface of the die pad. Thermal energy may also be conducted out of the package through the leads that are integral with the die pad.

While the package of FIGS. 1-1A is functional, it may offer certain drawbacks. One drawback is the requirement to perform wire bonding between the pads or the surface of the die, and the leads. Specifically, this wire bonding step is costly, as the bond wire material is typically made from gold, a highly expensive commodity.

The wire bonding step is also difficult to perform, as it requires the bond wires to be bent (strained) and then attached with some force and with high precision to the die and to a small target area at the ends of the leads. Fracture of the wire under the strain, or failure to accurately align the wire end, can enhance defects and reduce throughput. The force of attachment of the wire to the die in this step can also harm the die.

Moreover, the source and gate bond wire connections limit the ability of the package to dissipate thermal energy. In particular, the small volume of the bond wires offers only a small volume of thermally conducting material to transport heat out of the package.

Finally, the relatively small cross-sections offered by the bond wires may interfere with establishing a low resistance contact between the die and the leads. Conventional efforts to establish lower resistance contacts often amount to the use of more bond wires, exacerbating the cost issues described above. Moreover, use of multiple stitches of a bond wire to establish a low resistance contact the die surface, requires multiple attaching steps that again pose the danger of possibly damaging the die.

Other disadvantages may be offered by the use of long and/or multiple bond wires as electrical connection to the die. For example bond wires may offer larger inductance that can impair the switching behavior of MOSFETs. Also, bond wires can add uncontrolled external inductance or impedance to a Power IC, which would require compensation in the internal integrated circuitry.

Accordingly, there is a need in the art for improved package designs exhibiting favorable heat conduction and low cost fabrication.

BRIEF SUMMARY OF THE INVENTION

Embodiments in accordance with the present invention relate to packages for semiconductor devices, which feature a flip-chip die sandwiched between metal layers. One metal layer comprises portions of the lead frame configured to be in electrical and thermal communication with various pads on a first surface of the die (e.g. IC pads or MOSFET gate or source pads) through solder contacts. The other metal layer is configured to be in at least thermal communication with the opposite side of the die. Embodiments of packages in accordance with the present invention exhibit superior heat dissipation qualities, while avoiding the expense of wire bonding.

These and other embodiments of the present invention, as well as its features and some potential advantages are described in more detail in conjunction with the text below and attached figures.

BRIEF DESCRIPTION OF THE DRAWINGS

FIG. 2DA shows a simplified cross-sectional view of still another alternative embodiment of a package in accordance with the present invention.

FIGS. 2FA-FB show plan and cross-sectional views, respectively, of an alternative embodiment of a lead frame in accordance with an embodiment of the present invention.

FIGS. 2GA-GB show plan and cross-sectional views, respectively, of an alternative embodiment of a lead frame in accordance with an embodiment of the present invention.

FIGS. 2IA-IB show plan and cross-sectional views, respectively, of an alternative embodiment of a lead frame in accordance with an embodiment of the present invention.

FIGS. 2LA-LB show plan and cross-sectional views, respectively, of an alternative embodiment of a lead frame in accordance with an embodiment of the present invention.

DETAILED DESCRIPTION OF THE INVENTION

Figure 2:
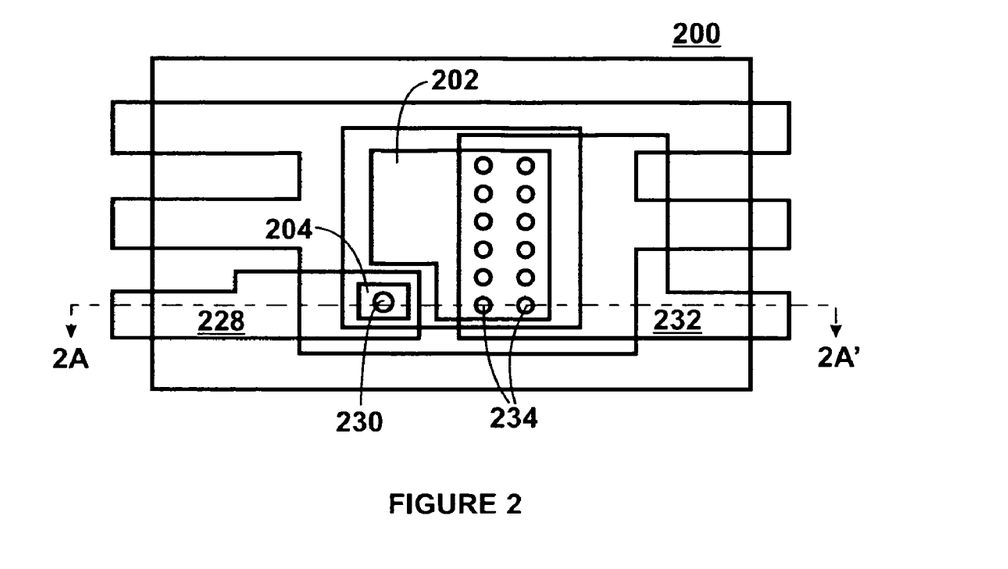
FIG. 2 shows a simplified plan view of a package in accordance with an embodiment of the present invention.
Figure 2A:
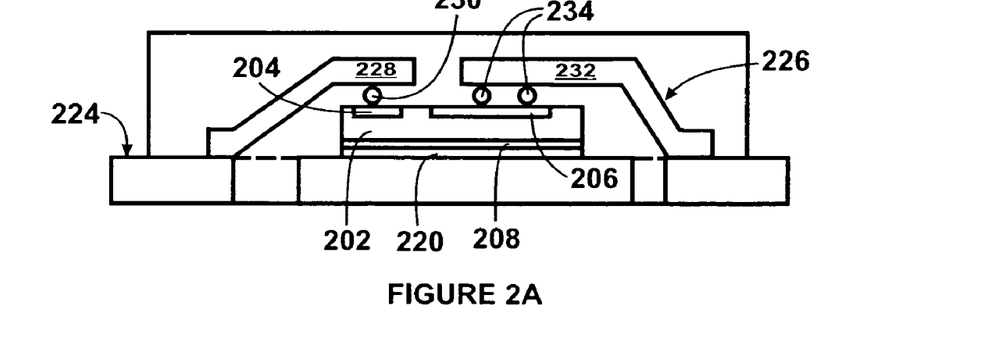
FIG. 2A shows a simplified cross-sectional view taken along line 2A-2A', of the package embodiment of FIG. 2.

FIG. 2 is a simplified plan view of an embodiment of a package in accordance with the present invention. FIG. 2A is a simplified cross-sectional view of the package of FIG. 2, taken along the cross-sectional line 2A-2A'.

Package 200 comprises MOSFET die 202 having a top surface featuring gate pad 204 and source pad 206. The bottom surface of MOSFET die 202 features a drain contact 208.

Drain contact 208 is in electrical communication with an underlying first metal layer 224, through electrically and thermally conducting adhesive material 220. One example of such an electrically and thermally conducting material is solder. In certain embodiments, the first metal layer can be provided pre-bumped with solder balls or pre-formed with a solderable contact surface.

Integral projections of the first metal layer 224 extend outside of the plastic package body to provide leads for electrical contact with the MOSFET drain. The underside portion of the first metal layer that is exposed by the package body, may serve as a heat sink.

Package 200 includes a second metal layer 226 overlying the die. A first portion of 228 of the second metal layer is in electrical communication with gate pad 204 through a solder connection 230. A second portion 232 of the second metal layer is in electrical communication with source pad 206 through multiple solder connections 234. Portions 228 and 232 of the upper metal layer 226 are in turn routed to extend out of the plastic package body to serve as leads for connection to the gate and source. This routing may involve changing the vertical height of the metal portions 228 and 232 to match the height of the first metal layer. In particular embodiments, the shape of the second metal layer can be formed by bending. In other embodiments, the second metal layer can be provided in a pre-formed shape.

The package design of FIGS. 2-2A may offer a number of advantages over conventional package designs. One advantage is the avoidance of wire bonding during fabrication. Instead, contact between the die and the second metal layer is provided by solder contacts that do not require bending and precise alignment of a metal bond wire. The use of such solder contacts instead of wire bonding reduces the incidence of defects and reduces the overall cost of fabricating the package.

Embodiments of the present invention may also offer advantageous electrical performance. For example, the reduced inductance of metal layers relative to bond wires offers reduced inductance, and may allow faster switching speeds. The use of metal layers in place of narrow bond wires may also advantageously offer a reduced resistance contact to the die housed by the package.

Another possible advantage offered by the embodiment of the package shown in FIGS. 2-2A, is an enhanced ability to dissipate heat. Specifically, the lower metal layer is in thermal communication with the drain contact of the die, and hence is able to conduct heat out of the package through the leads. And, in certain embodiments, a portion of the lower metal layer is exposed on the outside of the package, thereby serving as a heat sink to the surrounding environment.

Moreover, the upper metal layer is also in substantial thermal contact with large areas of the die through the solder connections, and in particular the source pad present on the upper surface of the die. This large area of contact further enhances the flow of heat from the die out of the package to the surrounding environment through the leads. And, in certain embodiments, a portion of the upper metal layer is exposed on the outside of the package, thereby serving as a heat sink to the surrounding environment.

While the specific embodiment of FIGS. 2-2A shows the use of solder balls to establish an electrical connection with only one side of the die, this is not required by the present invention. In accordance with alternative embodiments, solder balls could be employed to establish electrical communication with contacts on both sides of the die.

Figure 2B:
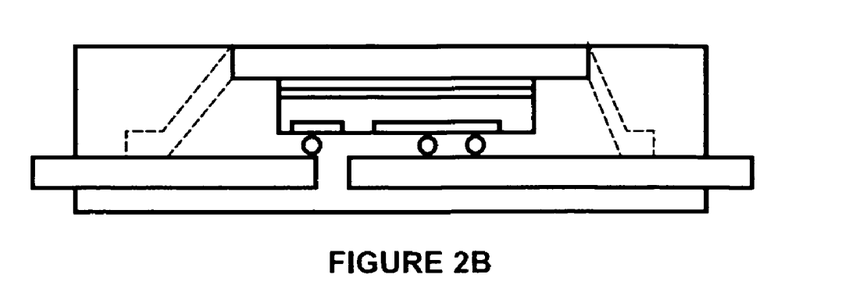
FIG. 2B shows a simplified cross-sectional view of an alternative embodiment of a package in accordance with the present invention.

And while the specific embodiment of FIGS. 2-2A shows the lower metal layer as being in contact with the drain and the upper metal layer as being in contact with the gate/source through solder connections, this is not required by the present invention. Alternative embodiments of the present invention could feature the lower metal layer in contact with the source and gate of the die, with the upper metal layer in contact with the drain. Such an embodiment is illustrated in the simplified cross-sectional view of FIG. 2B. Again, both metal layers would offer the desirable properties of high thermal conductivity and reliable, low cost fabrication.

Figure 2C:
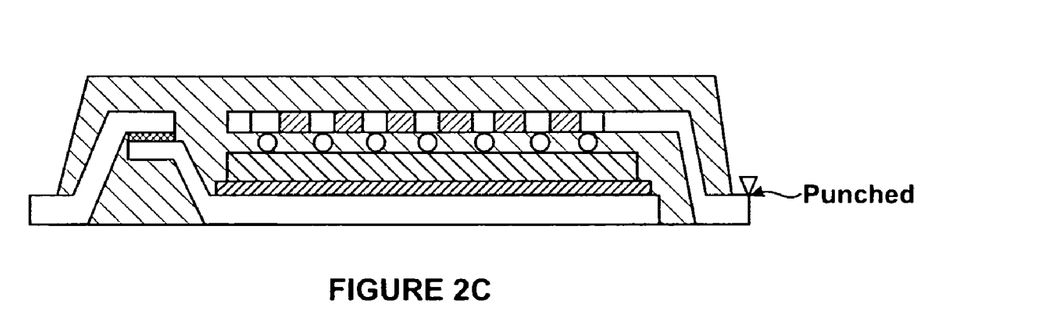
FIG. 2C shows a simplified cross-sectional view of another alternative embodiment of a package in accordance with the present invention.

Moreover, FIG. 2C shows a simplified cross-sectional view of another embodiment of a package in accordance with the present invention. In this particular embodiment, the lower metal layer is bent upward to contact a portion of the upper metal layer, which itself bends downward to extend out of the body of the package. The embodiment of FIG. 2C offers the benefit of ensuring that the upwardly projecting portion of the first metal layer remains securely embedded in the plastic body of the package. In addition, the design of FIG. 2C presents a square or rectangular profile of the heat sink, such that the integral portions of the lower metal layer exposed on the bottom of the package do not extend all the way to the sides of the package.

Following encapsulation of the die within the plastic package body, the package of FIG. 2C can be singulated from the surrounding material by punching through the exposed lead, such that a portion of the lead extends out of the package body and is available for testing. In accordance with alternative embodiments, the package may be singulated from the surrounding material through a sawing process, leaving the exposed leads flush with the surface of the package.

Figure 2D:
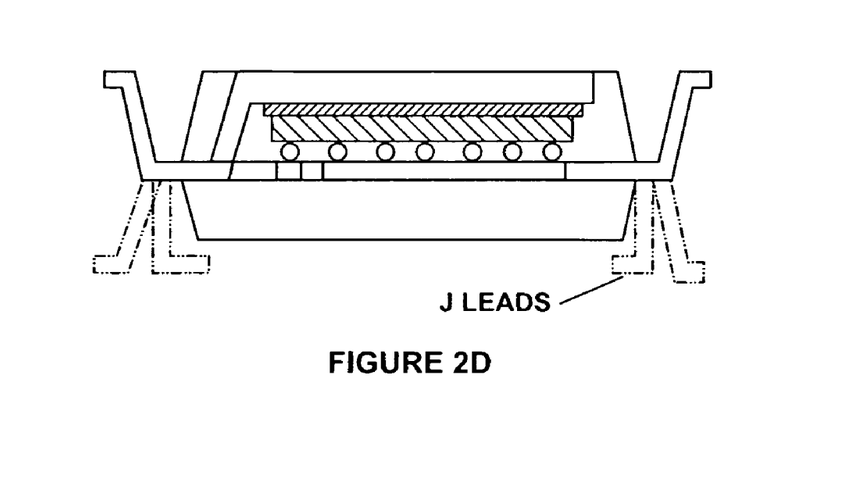
FIG. 2D shows a simplified cross-sectional view of yet another alternative embodiment of a package in accordance with the present invention.

FIG. 2D shows a simplified cross-sectional view of yet another embodiment of a package in accordance with the present invention. In this particular embodiment, the first and second metal layers are configured to project from a half-way point in the thickness of the package. Such a configuration imparts substantial flexibility of use to the package, as it allows the projecting leads to be bent in either direction (up or down), and in a variety of shapes (J-shaped, gull-wing shaped, reverse gull-wing shaped) depending upon the requirements of the environment in which the package is ultimately to be located.

FIG. 2DA shows a simplified cross-sectional view of yet another embodiment of a package in accordance with the present invention. This embodiment shows a reverse-gull wing shaped lead projecting upward toward the heat sink disposed on the top of the package.

Figure 2E:
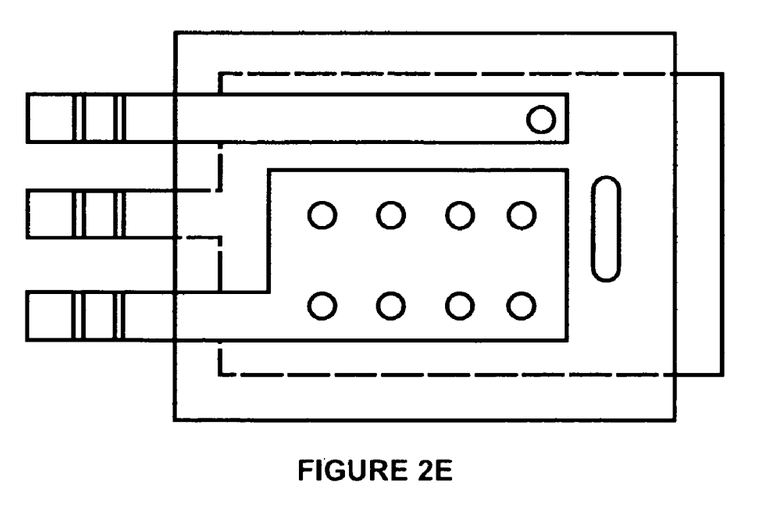
FIGS. 2E-EA show plan and cross-sectional views, respectively, of an embodiment of a lead frame in accordance with an embodiment of the present invention.

FIGS. 2E-2EA show simplified plan and cross-sectional views, respectively, of another embodiment of a package in accordance with the present invention. The package of FIGS. 2E-2EA includes projecting leads located on only one side of the package. A first projecting lead is formed from a portion of the lower metal layer that is positioned at mid-thickness of the package and in contact with a source pad on the die through solder contacts. A second projecting lead is also formed from a portion of the lower metal layer that is in contact with a gate pad on the die through a solder contact. A third projecting lead is formed from a portion of the upper metal layer which is in contact with the drain pad of the die, and which is bent downward before ultimately exiting the package body at the mid-thickness height. As shown in FIG. 2E, the upper metal layer may include an aperture that allows penetration of the plastic encapsulant of the package body, thereby assisting with mechanical interlocking of the upper metal layer within the package.

The embodiments described so far relate to packages housing MOSFET devices having three (gate, source, drain) terminals. However, the present invention is not limited to housing a die of this type. Alternative embodiments of packages in accordance with the present invention can be configured to house die having fewer or more terminals.

For example, FIGS. 2FA-B show plan and cross-sectional views along line 2F-2F', of a lead frame for a planar two-terminal device (such as a diode) in accordance with an embodiment of the present invention. The lead frame includes a lower metal layer in thermal communication only with a back of the die. The two portions of the upper metal layer are in electrical communication with respective contacts on the upper side of the die.

Similarly, FIGS. 2GA-B show plan and cross-sectional views along line 2G-2G', of a lead frame for a vertical two-terminal device (such as a diode) in accordance with an embodiment of the present invention. The lead frame includes a lower metal layer in electrical communication with a contact on the back side of the die, and an upper metal layer in electrical communication with a contact on the front side of the die.

Figure 2H:
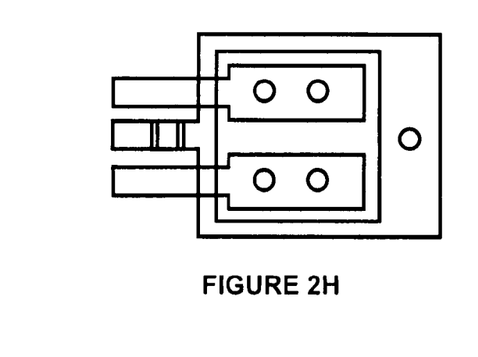
FIG. 2H shows a simplified plan view of an embodiment of a lead frame in accordance with the present invention.

FIG. 2H shows a plan view of a lead frame for a package for a dual device, but having three terminals, two of which are connected to the same portion of the device. In particular, the lower metal layer is in electrical communication with a back side contact, and the upper metal layer defines two portions, each in electrical communication with the front-side contact. The particular package shown in FIG. 2H is a TO-220/247/251 type package, featuring a tag hole configured to receive a screw in order to secure the package to a supporting structure. Other embodiments include TO263/252 type package with external leads to the plastic body bent or pre-formed to meet the same plane of the Drain heatsink.

While the embodiments of packages and lead frames just described are designed for a single die, this is not required by the present invention. Alternative embodiments in accordance with the present invention could be configured to house multiple die.

For example, FIGS. 2IA-B show simplified plan and cross-sectional views along line 2I-I', of an embodiment of a lead frame in accordance with the present invention, which is configured to house two dual die. In this particular embodiment, the two die share the same terminal for a common backside contact, and have separate terminals and contacts on their front sides.

Figure 2J:
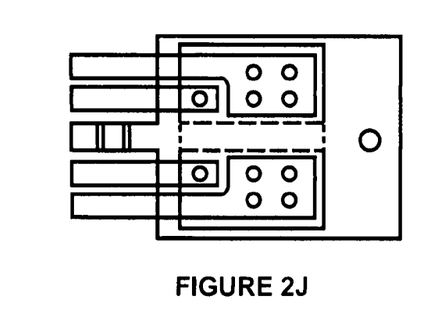
FIG. 2J shows a simplified plan view of an embodiment of a lead frame in accordance with the present invention.

FIG. 2J shows a simplified plan view of an embodiment of a lead frame in accordance with the present invention, which is configured to house two MOSFET die. In this particular embodiment, the two MOSFET die share the same terminal for a common backside contact (drain), and have separate terminals and contacts for the source and gate contacts on the front side of the die.

Figure 2K:
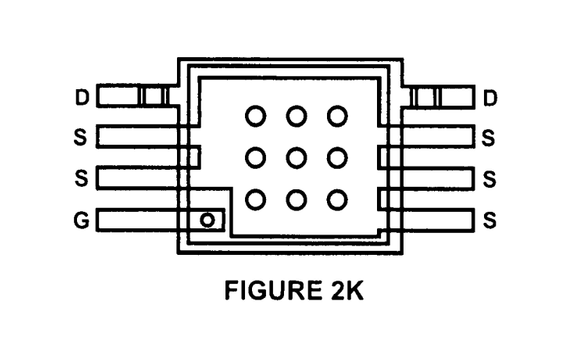
FIG. 2K shows a simplified plan view of an embodiment of a lead frame in accordance with the present invention.

While the embodiment of FIG. 2J shows a configuration having a single terminal for each of the source, drain, and gate contacts, this is not required by the present invention. FIG. 2K shows a simplified plan view of a lead frame for a MOSFET die having multiple terminals for the source (S) and drain (D).

Figure 2M:
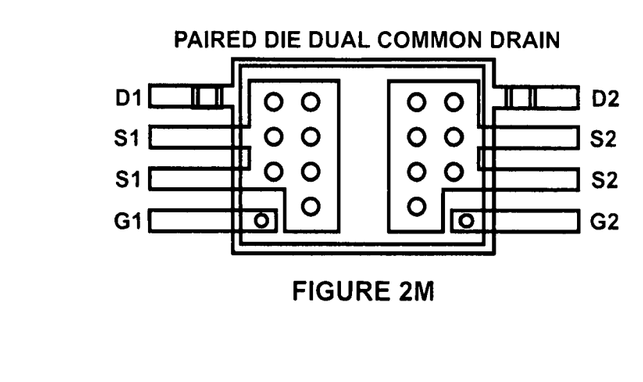
FIG. 2M shows a simplified plan view of an embodiment of a lead frame in accordance with the present invention.

Similarly, FIGS. 2LA-B show simplified plan and cross-sectional views for a lead frame having multiple source terminals for each of two MOSFET die having drains isolated from each other. The portions of the lead frame in contact with these drains are secured together by a tie-bar structure that is severed (for example by punching) after the molding step. FIG. 2M shows a simplified plan view of a lead frame supporting two die having a common drain contact with two terminals (D1, D2), multiple source terminals for each die.

Figure 2N:
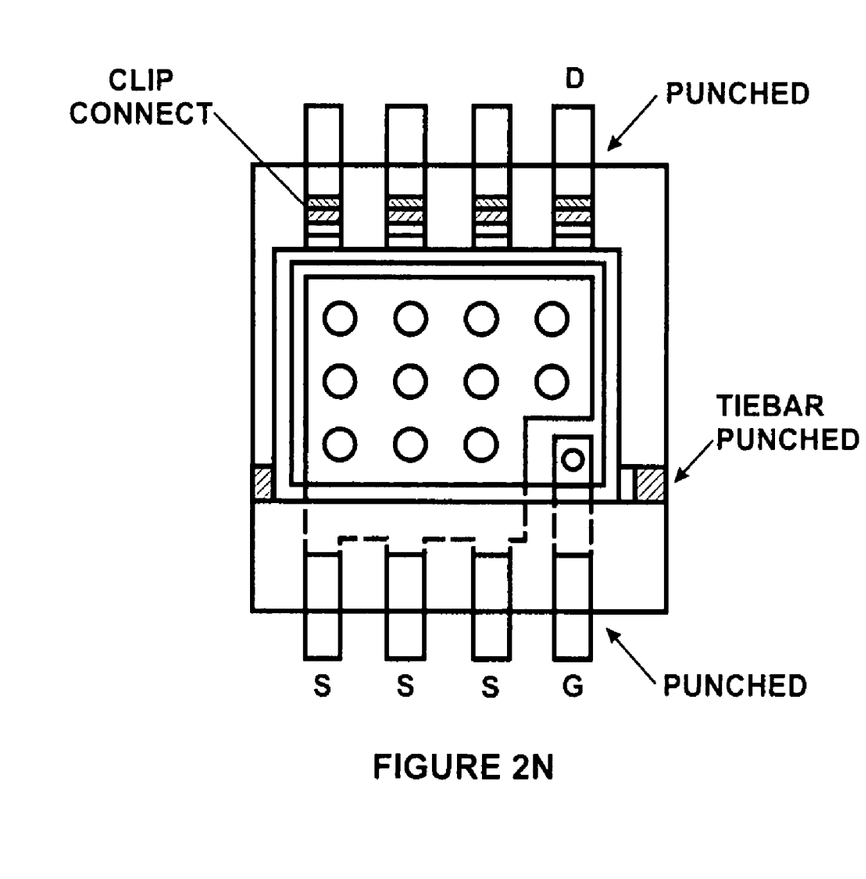
FIG. 2N shows a simplified plan view of an embodiment of a lead frame in accordance with the present invention.
Figure 2O:
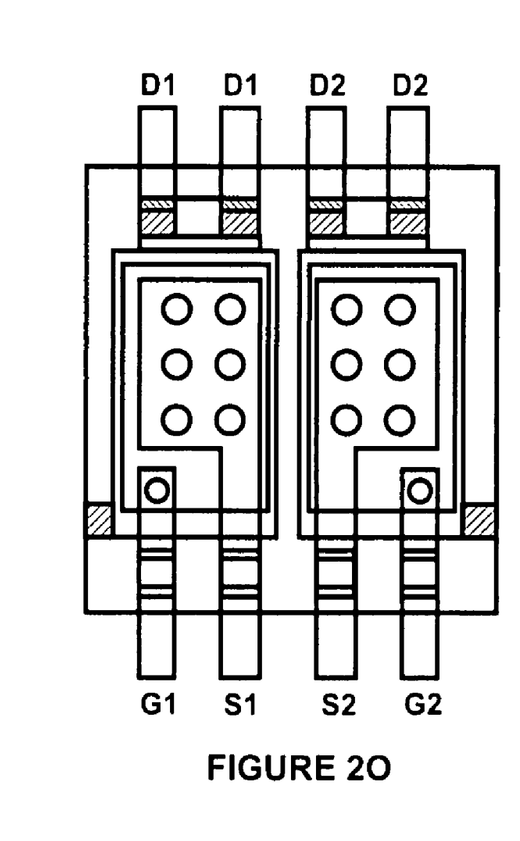
FIG. 2O shows a simplified plan view of an embodiment of a lead frame in accordance with the present invention.

Similarly, FIG. 2N shows a plan view of another embodiment of a lead frame that features multiple source terminals, and multiple drain terminals with respective clip connections, and which further includes tie-bar connections that are severed from the surrounding metal matrix during singulation and after molding. FIG. 2O shows a simplified plan view of another embodiment of a lead frame housing multiple MOSFET die with pairs of ganged drain terminals to each, and also includes tie-bars.

While the embodiments described so far relate to lead frames and packages configured to house the same type of die, this is also not required by the present invention. Alternative embodiments could be configured to house different die types, for example MOSFETs and integrated circuits (ICs).

Figure 3A:
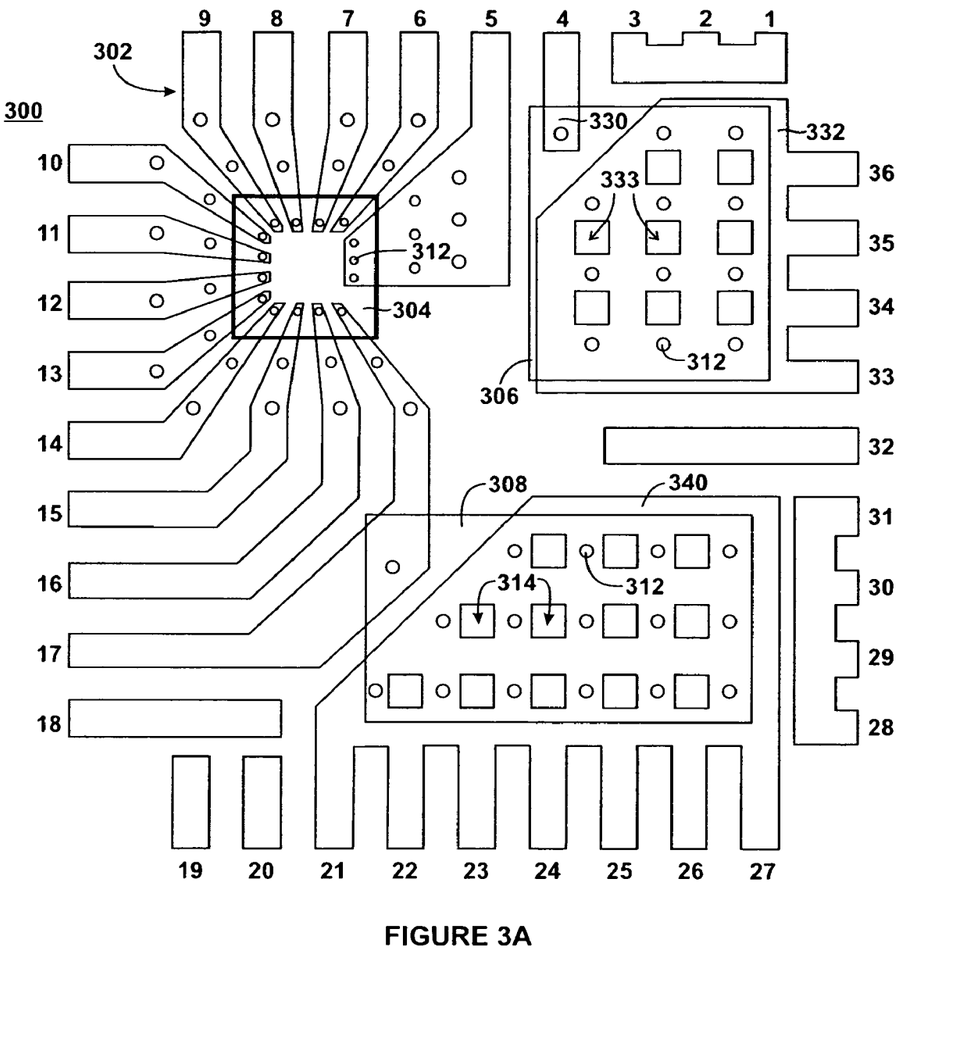
FIG. 3A shows a simplified plan view of the upper metal layer of an alternative embodiment of a lead frame in accordance with the present invention, that is configured to support multiple die.
Figure 3B:
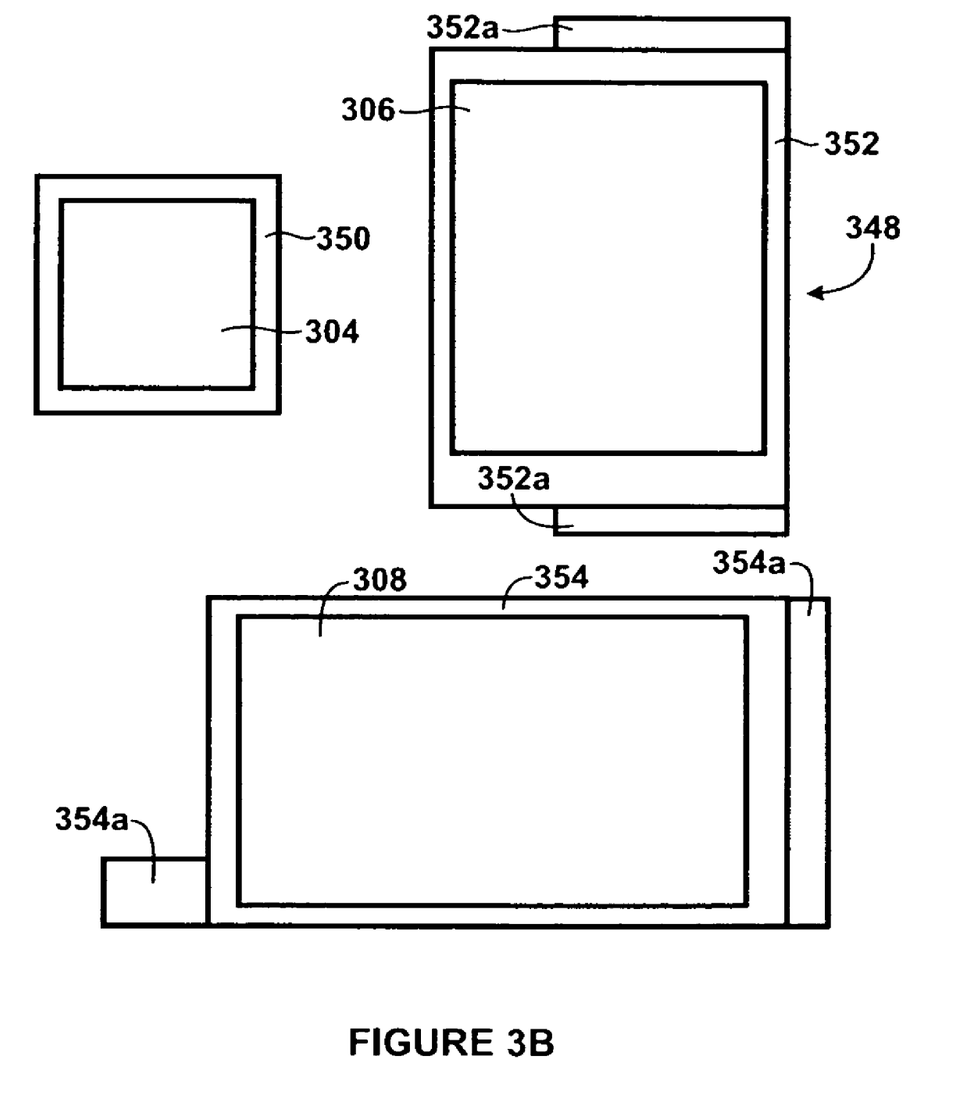
FIG. 3B shows a simplified plan view of the lower metal layer of an alternative embodiment of a lead frame in accordance with the present invention, that is configured to support multiple die.
Figure 3C:
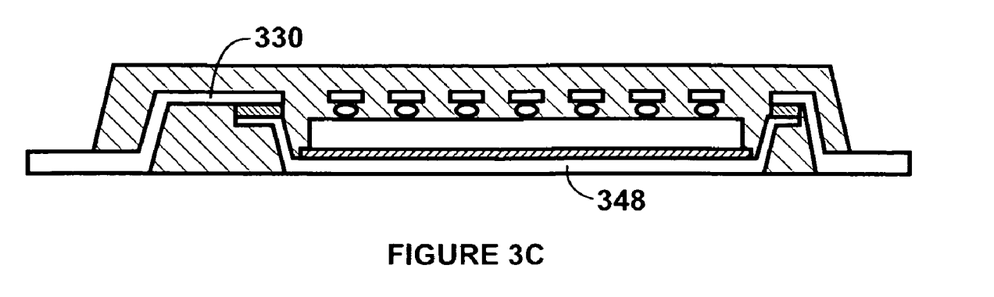
FIG. 3C shows a simplified cross-sectional view of an embodiment of a package in accordance with the present invention that is configured to house multiple die.

For example, FIGS. 3A-B present plan views of a lead frame 300 in accordance with an alternative embodiment of the present invention. FIG. 3A shows a plan view of the upper metal layer 302 and the three packaged die 304, 306, and 308, while FIG. 3B shows a plan view of the lower metal layer 310 and the packaged die 304, 306, and 308. FIG. 3C shows a simplified cross-sectional view.

The upper metal layer 302 of the lead frame defines the leads in contact with various pads on the upper surface of the housed die. For example, die 304 represents an IC die having many contacts on its upper surface. Accordingly, the upper metal layer 302 of the lead frame comprises a plurality of leads (nos. 5-17) extending over these pads, with intervening solder contacts 312 providing the necessary electrical and thermal communication with the die.

Moreover, the leads of the upper metal layer 302 of the lead frame are not limited to contacting an IC die of a particular size. Thus, as shown in FIG. 3A, these leads include two sets of solder contacts to accommodate IC die occupying larger footprints.

By contrast, die 306 and 308 are MOSFETs having only a gate pad and a larger source pad on each of their top surfaces. Accordingly, the upper metal layer includes only two separate portions for each MOSFET die, which extend over the respective gate/source pads and is in thermal and electrical communication with each through an intervening solder contact(s) 312. Specifically, upper metal portion 330 is in contact with the gate pad of MOSFET die 306 (lead no. 4), and larger upper metal portion 332 is in contact with the source pad of die 306 (lead nos. 33-36).

Although not required, in this particular embodiment the larger upper metal portion 332 comprises a grid-like structure defining a pattern of apertures 333. These apertures reduce the thermal strain in the larger metal portion that results from shrinking and expansion in response to the changing thermal environment inside the package.

While the apertures of the embodiment of FIG. 3A are square-shaped, this is not required by the present invention. Alternative embodiments could feature metal layers defining apertures of other shapes, including but not limited to circular or polygonal, depending upon the particular application.

Similarly, larger portion 340 of the upper metal layer allows thermal and electrical contact with the source pad MOSFET die 308 (lead nos. 21-27). In the particular embodiment of FIGS. 3A-B, the same (wider) portion of the upper metal layer (corresponding to lead no. 17) provides a common contact with both the IC and the gate pad of MOSFET die 308.

The upper metal layer 302 features solitary leads (nos. 18-20 and 32) and ganged leads (nos. 1-3 and 28-31). As described particularly below, leads 1-3, 28-31, and 32 and are in electrical communication with the drain pads on the underside of the MOSFET die, through the lower metal layer.

As indicated in the cross-sectional view of FIG. 3C, prior to emerging from the package body, the extending leads from the upper metal layer of the lead frame 300 are bent downward, so that they ultimately project from the bottom of the thickness of the package. However, this is not required by the present invention. In other embodiments the upper metal layer could emerge at an upper portion of the side of the package, for bending in either direction as described above in connection with FIG. 2D.

The configuration of the lower metal layer 348 shown in FIG. 3B, is simpler than of the upper metal layer. In certain embodiments, portion 350 of the lower metal layer underlying IC die 304, is not in electrical communication with the IC die at all. Accordingly, portion 350 is not in contact with any lead, but is exposed on the bottom of the package to provide a heat sink. In certain embodiments that require the IC to be grounded and connected to a pin, the electrical connect is provided by connecting, in this example, 350 to pin 5 in FIG. 3A.

In particular embodiments requiring connection between two or more die, the connect is provided by having two (or multiple) ball contact locations on an appropriately patterned and continuous pin. Pin 17 in FIG. 3A is such an example, which connects the IC and the Gate of the MOSFET.

Portion 352 of the lower metal layer is in electrical and thermal communication with the drain pad on the underside of MOSFET die 306. Regions 352a jog upward to meet the ganged pins 1-3 and solitary pin 32 of the upper metal layer, thereby providing contact with the drain of MOSFET die 306. These upward jogs in the lower metal layer also serve to provide mechanical interlocking of that layer in the encapsulant of the plastic package body. The underside of lower metal portion 352 is also exposed by the underside of the package to provide a heat sink.

Portion 354 of the lower metal layer is in electrical and thermal communication with the drain pad on the underside of MOSFET die 308. Portions 354a jog upward to meet the ganged pins 28-31 and pin 18 of the upper metal layer, thereby providing contact with the drain of MOSFET die 308. These upward jogs in the lower metal layer also serve to provide mechanical interlocking of that layer in the encapsulant of the plastic package body. The underside of lower metal portion 354 is also exposed by the underside of the package to provide a heat sink.

In the particular embodiment of the package of FIGS. 3A-B, pin no. 18 serves to provide mounting and electrical connection to the heat sink of the drain of the MOSFET 308. Pin nos. 19 and 20 are no connect pins in this embodiment, but can serve as spare locations for thermal and electrical connections in other embodiments.

The embodiment of the lead frame just described, offers certain advantages. One advantage is ready adaptability to house different configurations of die and die sizes. For example, while the MOSFET die are shown occupying the majority of the area available on the grid-like lower metal portions, this is not required. The embodiment of a lead frame shown in FIGS. 3A-B can be configured to house MOSFET die occupying a smaller footprint or a different footprint that fits within the upper metal portion. In certain such embodiments, the location of a particular contact (such as the gate) may be fixed, with the location of other contacts (such as to the source) able to vary in space depending upon the size and shape of the die.

Figure 4:
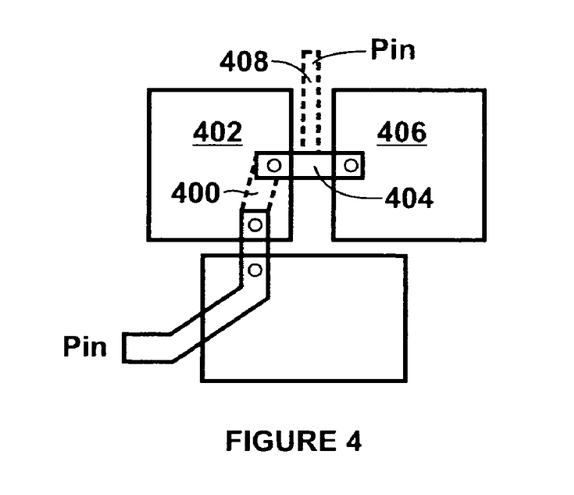
FIG. 4 shows a simplified plan view of an arrangement of multiple die in a lead frame according to an embodiment of the present invention.

Portions of the metal layers of a lead frame projecting as pin(s) from the body of the package in accordance with embodiments of the present invention, can function internal to the package to perform a signal routing function between two or more separate die mounted on the same horizontal plane according to application needs. For example, FIG. 4 shows a simplified schematic view of an embodiment, wherein IC die 401 and MOSFET die 402 are connected through a continuous pin with solder ball connections. Furthermore, FIG. 4 shows according to certain embodiments, this continuous pin connection can be extended as portion 400 and then to portion 404, which provides continuous signal routing between contacts on the IC die 402 and MOSFET die 406. In certain embodiments, the portion 404 extends as projected pin portion 408.

While the embodiments shown so far depict a package and lead frame configured to house multiple die located with signal routing in the same horizontal plane, this is not required by the present invention. Alternative embodiments of packages and lead frames in accordance with the present invention may feature multiple die oriented in a vertical stack or other orientations.

Figure 5:
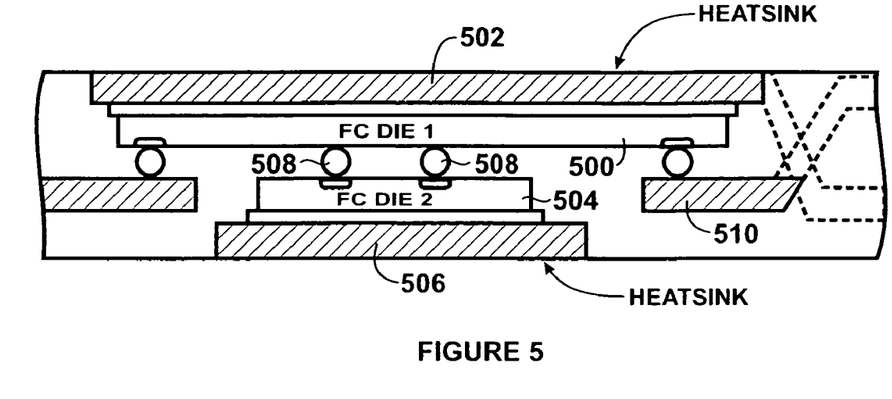
FIG. 5 shows a simplified cross-sectional view of an embodiment of a package in accordance with the present invention featuring multiple die in a stacked configuration.

For example, FIG. 5 shows a simplified cross-sectional view of an embodiment of a package configured to house two flip-chip die. The first flip-chip die 500 is supported on the underside of an upper metal layer 502 of the lead frame. The second flip-chip die 504 is supported on a lower metal layer 506 of the lead frame. Contacts on the surfaces of die 500 and 504 are in electrical communication with each other through solder balls 508. Other contacts on the surface of the first die 500 are in electrical contact with a middle metal layer 510.

Apart from the stacked die configuration, a couple of aspects of the embodiment of FIG. 5 are worthy of note. First, the package of FIG. 5 has exposed heat sinks on both of its sides. One such heat sink could be in thermal communication with the underlying PC board, with the other heat sink in thermal communication with the surrounding environment. It is to be understood that such use of multiple heat sinks is also possible for one or more of the embodiments previously described.

Second, embodiments in accordance with the present invention are not limited to the use of two or any number of multiple metal layers, or to incorporating only two die. Rather, embodiments of the present invention can utilize multiple metal layers sandwiching any number of desired die.

As described above in connection with FIGS. 3A-C, lead frames according to embodiments of the present invention offer flexibility to package designers, by allowing die of multiple sizes to be supported on the various metal layers. Further flexibility in package design may be achieved by combining multiple modules in a sandwiched configuration according to embodiments of the present invention.

Figure 6:
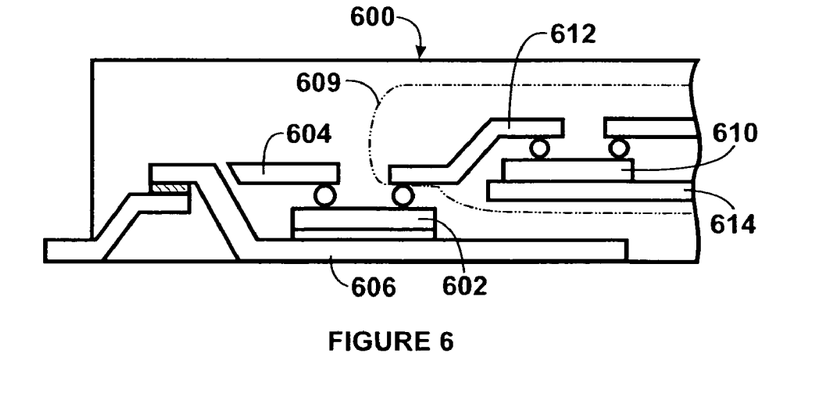
FIG. 6 shows a simplified cross-sectional view of an alternative embodiment of a package in accordance with the present invention.

For example, FIG. 6 shows package 600 of FIG. 6 including a first flip-chip die 602 sandwiched between first and second metal layers 604, 606 as shown. Fabrication of a multi-chip module (MCM) is completed by incorporating a module 609 comprising a second flip-chip die 610 that is itself sandwiched between metal layers 612 and 614. Allowing the package to be assembled from a plurality of sandwiched die components, in a manner analogous to the interlocking pieces of a puzzle, imparts substantial additional flexibility in the design of a package for particular needs.

Figure 7:
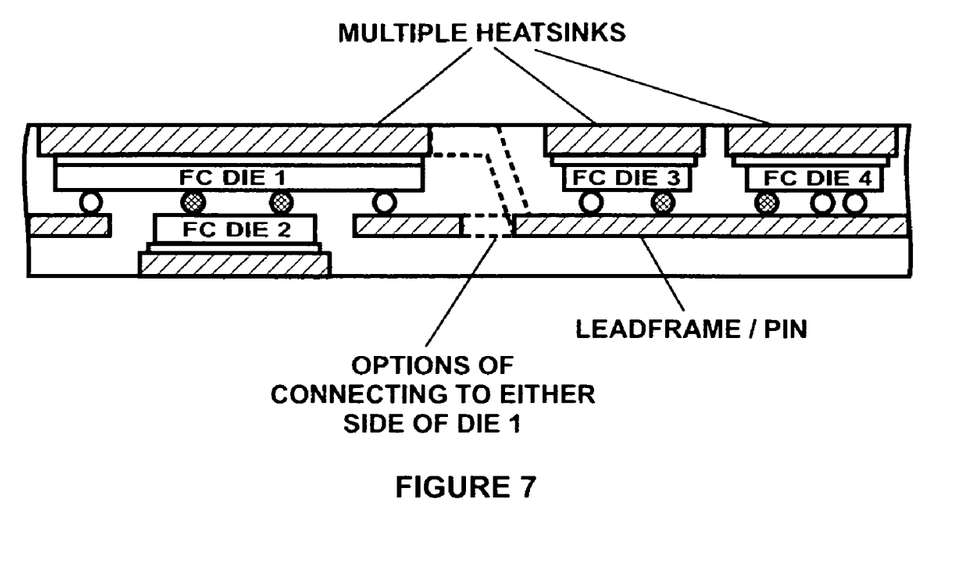
FIG. 7 shows a simplified cross-sectional view of an alternative embodiment of a package in accordance with the present invention.

FIG. 7 shows a simplified cross-sectional view of still another embodiment of a package in accordance with the present invention, that is formed from a plurality of smaller elements. In particular, the package comprises die having interconnects and signal routing in the same plane through a solder ball contact with one of the metal layers of the sandwich (e.g. through the shaded solder balls and the lower metal layer between FC DIE 3 and FC DIE 4). The package also includes die having vertical interconnections and signal routing with each other through solder ball contacts (e.g. through the shaded solder balls and between FC DIE 1 and FC DIE 2). In this package, the lower metal layer of the sandwich could remain in the lower plane to establish contact with the lower metal layer supporting one of the vertically connected die, or could be bent upward to establish contact with the upper metal layer in contact with the upper of the vertically connected die. The package of FIG. 7 includes heat sinks on both sides, with the top side having multiple heat sinks.

Embodiments in accordance with the present invention are not limited to housing particular types of die. However, certain types of die such as power devices are particularly suited for packaging according the present invention. For purposes of the instant application, the term "power device" is understood to refer to semiconductor devices used as switches or rectifiers in power electronic circuits. These include but are not limited to discrete devices such as diodes, power MOSFETs, insulated gate bipolar transistors (IGBTs), and Power Integrated Circuits used in the analog or digital control of the discrete devices.

In combination, the power devices are commonly employed to provide power management functions such as power supply, battery charging control systems. Power discrete devices having a planar or vertical structure, can handle power from a few milliwatts to tens of kilowatts. For the packages described above, a typical power device may operate at between about 500 W and 5 mW. In the off state, reverse breakdown can occur at voltages from about a few volts up to about 2000 volts. The operating current for power devices can range from a few milli-Amperes, to several hundred Amperes.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A package for a semiconductor device, the package comprising:
a first metal layer configured to be in thermal and electrical communication with a power device die; and
a second metal layer disposed on an opposite side of the power device die from the first metal layer, the second metal layer configured to be in electrical and thermal communication with a pad on a surface of the power device die through physical contact with a solder ball contact, the first metal layer comprising integral leads projecting from a plastic package body encapsulating the power device die, the solder ball contact, and at least a part of the first and second metal layers.

2. The package of claim 1 wherein a portion of the first metal layer is exposed by the plastic package body to form a heat sink.

3. The package of claim 1 wherein a portion of the second metal layer is exposed by the plastic package body to form a heat sink.

4. The package of claim 1 further comprising a second power device die that is configured to be in electrical communication with a portion of the second metal layer.

5. The package of claim 4 wherein a portion of the second metal layer is configured to be in electrical communication with the first power device die and with the second power device die.

6. The package of claim 5 wherein the portion of the second metal layer is in vertical electrical communication with the first metal layer.

7. The package of claim 5 wherein the first power device die is a MOSFET and the portion of the second metal layer is configured to be in electrical communication with a gate of the first power device die.

8. The package of claim 4 wherein the second metal layer is configured to receive the solder ball contact at a fixed location, and to receive other solder ball contacts to the first power device die at different locations depending upon a size or shape of the first power device die.

9. The package of claim 4 further comprising a third power device die disposed above or below the second die and having a pad in electrical communication with a pad of the second power device die through a solder ball.

10. The package of claim 1 wherein the power device die comprises an integrated circuit (IC) die, and the second metal layer comprises a plurality of portions configured to be in electrical communication with respective pads on the surface of the IC die.

11. The package of claim 10 wherein the first metal layer is configured to be in electrical communication with a second surface of the IC die.

12. The package of claim 1 wherein a portion of the second metal layer defines an aperture.

13. A package for a semiconductor device, the package comprising:
   a first metal layer configured to be in at least thermal communication with a first side of a first power device die;
   a second power device die located above or below the first power device die and in electrical contact with a second side of the first power device die through physical contact with a solder ball contact; and
   a second metal layer disposed on an opposite side of the second power device die from the first power device die, the second metal layer configured to be in at least thermal communication with the second power device die, the first metal layer or the second metal layer comprising integral leads projecting from a plastic package body encapsulating the first power device die, the solder ball contact, and at least a part of the first and second metal layers, wherein the first power device die or the second power device die is in electrical communication with the first metal layer or the second metal layer.

14. The package of claim 13 wherein the first power device die is in electrical communication with a third metal layer located between the first and second metal layers, through a second solder ball contact.

15. The package of claim 13 wherein a portion of the first metal layer is exposed by the plastic package body to form a heat sink.

16. The package of claim 13 wherein a portion of the second metal layer is exposed by the plastic package body to form a second heat sink.

17. A method of packaging a semiconductor device, the method comprising:
   providing a first metal layer configured to be in thermal and electrical communication with a first surface of a power device die wherein the first metal layer is provided with a portion bent out of a plane of the first metal layer to form a lead exposed by a package body;
   providing a second metal layer configured to be in thermal and electrical communication with a second surface of the power device die opposite the first side, through physical contact with a solder ball contact; and
   encapsulating the die, the solder ball, and at least a part of the first and second metal layers within a plastic encapsulant to form the package body.

18. The method of claim 17 wherein encapsulating the power device die exposes a portion of the first metal layer as a heat sink.

19. The method of claim 17 wherein encapsulating the power device die exposes a portion of the second metal layer as a second heat sink.

20. The method of claim 17 further comprising bending a portion of the second metal layer out of a plane of the second metal layer to form a lead exposed by the package body.

21. The method of claim 17 wherein the second metal layer is provided with a portion bent out of a plane of the second metal layer to form a lead exposed by the package body.

22. A package of forming a package for a semiconductor device, the method comprising:
   providing a first metal layer configured to be in at least thermal communication with a first side of a first power device die;
   providing a second power device die located above or below the first power device die and in electrical contact with a second side of the first power device die through physical contact with a solder ball contact; and
   providing a second metal layer disposed on an opposite side of the second power device die from the first power device die, the second metal layer configured to be in at least thermal communication with the second power device die, the first metal layer or the second metal layer comprising integral leads projecting from a plastic package body encapsulating the first power device die, the solder ball contact, and at least a part of the first and second metal layers, wherein the first power device die or the second power device die is in electrical communication with the first metal layer or the second metal layer.

* * * * *